United States Patent [19]

Nagai et al.

[11] Patent Number: 4,587,162

[45] Date of Patent: May 6, 1986

[54] RESIN COMPOSITION AND LAMINATE PRODUCED THEREFROM COMPRISING A CYCLIZED POLYBUTADIENE AND A PREPOLYMER OF A ISOCYANURIC OR CYANURIC ACID DERIVATIVE

[75] Inventors: Akira Nagai, Hitachi; Akio Takahashi, Hitachiota; Katuo Sugawara; Masahiro Ono, both of Hitachi; Ritsuro Tada, Mito; Motoyo Wajima, Hitachi; Toshikazu Narahara, Ibaraki, all of Japan

[73] Assignee: Hitachi, Ltd., Tokyo, Japan

[21] Appl. No.: 754,449

[22] Filed: Jul. 12, 1985

[30] Foreign Application Priority Data

Jul. 18, 1984 [JP] Japan ................................ 59-147628

[51] Int. Cl.$^4$ ..................... B32B 27/00; G03C 1/68; C08L 39/04
[52] U.S. Cl. .................................. 428/290; 525/204; 525/281; 430/286; 430/287
[58] Field of Search ................. 525/281, 204; 428/290

[56] References Cited

U.S. PATENT DOCUMENTS

| 4,268,433 | 5/1981 | Sawatari et al. | 525/194 |
| 4,323,662 | 4/1982 | Oba et al. | 525/260 |
| 4,330,612 | 5/1982 | Tashiro et al. | 204/159.22 |
| 4,360,560 | 11/1982 | Kopnick et al. | 428/290 |
| 4,460,638 | 7/1984 | Haluska | 428/290 |
| 4,481,279 | 11/1984 | Naito et al. | 204/159.13 |
| 4,541,894 | 9/1985 | Cassat | 428/290 |

FOREIGN PATENT DOCUMENTS

| 57-448 | 4/1983 | Japan . |
| 0104911 | 6/1983 | Japan . |

OTHER PUBLICATIONS

Harita et al., Polym. Eng. Sci. 17, 372–376, (1977).

*Primary Examiner*—Herbert J. Lilling
*Attorney, Agent, or Firm*—Antonelli, Terry & Wands

[57] ABSTRACT

A resin composition comprising a prepolymer of homopolymer or copolymer of isocyanuric acid derivative or cyanuric acid derivative, and a cyclized polybutadiene can give a laminate for multi-layer printed circuit boards excellent in heat resistance, dimensional stability and high-frequency electrical properties.

14 Claims, No Drawings

RESIN COMPOSITION AND LAMINATE PRODUCED THEREFROM COMPRISING A CYCLIZED POLYBUTADIENE AND A PREPOLYMER OF A ISOCYANURIC OR CYANURIC ACID DERIVATIVE

BACKGROUND OF THE INVENTION

This invention relates to a resin composition and a laminate produced therefrom particularly suitable for malti-layer printed circuit boards excellent in heat resistance and high-frequency electrical properties.

Laminates made from phenol resins, epoxy resins and polyimide resins have mainly been used as laminating materials for multi-layer printed circuit boards. With recent progress for high speed treatment of large scale computers, printed circuit boards excellent in high-frequency electrical properties have been demanded in order to improve the signal transmitting rate. Particularly, in order to shorten the transmission delayed time and to thin the thickness of circuit boards, printed circuit boards having a low dielectric constant are disclosed (e.g. Proc. Int. Printed Circuits Cont., 1979, P. 179). As laminating materials for printed circuit boards having such excellent high-frequency electrical properties, there have been developed polytetrafluoroethylene laminates, butadiene resin laminates, and the like.

But in the case of polytetrafluoroethylene laminates, since the resin composition is a thermoplastic resin and very large in thermal expansion coefficient at high temperatures, there arises a problem in dimensional stability. Further, since the melting point of polytetrafluoroethylene in very high and there is no suitable solvent for preparing a vernish thereof, there is generally employed a laminating process by melt contact bonding with heating. Therefore, there are many difficulties in processability and moldability compared with conventional producing methods. A great change in the producing process is thus demanded.

On the other hand, in the case of butadiene resin laminates, since there can be obtained no solid prepreg at near room temperature in the production of prepreg when a low molecular weight polybutadiene is used, processability in winding up, laminating, and the like is worsened remarkably due to sticking properties of the prepreg. In order to solve such a problem, there is used a high molecular weight polybutadiene which is solid at near room temperature. But there arises another problem in that there can be obtained almost no fluidity at the time of molding with heating, that is, no fluidity can be obtained. Therefore, it is proposed to use two kinds of polybutadienes having different molecular weights mentioned above (Japanese Patent Examined Publication No. 21926/83). In such a case, the above-mentioned problem can be solved to some extent, but the problem of sticking properties at the time of prepreg production still remains unsolved.

It is also proposed to use a cyclized polybutadiene in place of the high molecular weight polybutadiene (Japanese Patent Examined Publication No. 57448/83), but the problem of insufficiency in mechanical strength and heat resistance, which problem is common to butadiene resin laminates, still remains unsolved.

SUMMARY OF THE INVENTION

This invention provides a resin composition, a laminate suitable as a material for producing multi-layer printed circuit boards excellent in heat resistance, dimensional stability and high-frequency electrical properties, and a process for producing the same.

This invention provides a resin composition comprising.

a prepolymer prepared by polymerizing at least one compound of the formula:

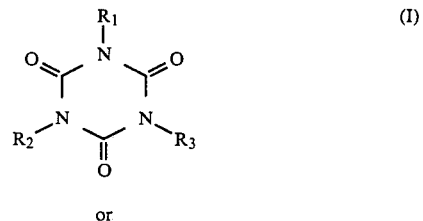

or

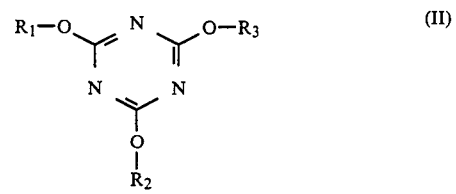

wherein $R_1$ through $R_3$ are independently hydrogen or an organic group, at least two of $R_1$, $R_2$ and $R_3$ being organic groups having at least one polymerizable unsaturated bond, and a cyclized polybutadiene.

This invention also provides a laminate produced by laminating and curing two or more prepregs obtained by impregnating a substrate with the resin composition mentioned above.

This invention further provides a process for producing a laminate which comprises a step of adding a radical polymerization initiator to the resin composition mentioned above and impregnating a sheet substrate with the resulting resin composition, a step of drying the resulting resin impregnated substrate to form a prepreg, and a step of piling two or more prepregs thus obtained and molding under pressure with heating.

DESCRIPTION OF THE PREFERRED EMBODIMENTS

The laminating material of this invention has a low dielectric onstant and is excellent in high-frequency electrical properties.

A cyclized polybutadiene is known as a resin to provide laminates excellent in high-frequency electrical properties, but has a problem in heat resistance due to a low pyrolysis beginning temperature. Further, it takes a rubber state when used as a structural material for laminates, so that there is a problem in that mechanical strength is low.

On the other hand, the compound of the formula (I) or (II) can form a linear polymer to give a prepolymer, which becomes a thermosetting resin by adding a suitable radical polymerization initiator. The resulting resin is high in mechanical strength and excellent in heat resistance. But when such a resin is used as a laminate for producing multi-layer printed circuit boards, there arise the following problems. That is, the resin is poor in affinity to glass cloth and very brittle, so that it is poor in flexibility and cracks are easily produced at the time of lamination or punching or drilling through-holes.

Further, the resin is very poor in adhesive strength to copper, which results in causing a problem of improving the peeling strength against copper when used in printed circuit boards.

But the above-mentioned problems are overcome by using the two together according to this invention.

In the compound of the formula:

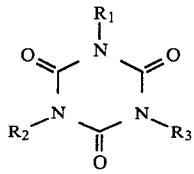

or the compound of the formula:

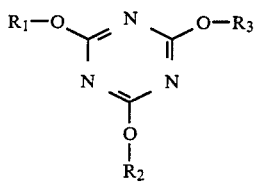

$R_1$ through $R_3$ are independently hydrogen or an organic group, and at least two of $R_1$, $R_2$ and $R_3$ should be organic groups having at least one polymerizable unsaturated bond. The organic group includes an alkenyl group preferably having 2 to 5 carbon atoms, an alkenoyl group preferably having 2 to 5 carbon atoms, an alkenoxycarbonyl group preferably having 2 to 5 carbon atoms, and an acyloxy group preferably having 2 to 5 carbon atoms. More concretely, the organic group having at least one polymerizable unsaturated bond includes groups of the formula: —CH=CH$_2$, —CH$_2$—CH=CH$_2$, —COCH=CH$_2$, —COC(CH$_3$)=CH$_2$, —COOCH=CH$_2$, —COOCH$_2$—CH=CH$_2$, —COOC(CH$_3$)=CH$_2$, —COOCH=CH$_2$, —COOC(CH$_3$)=CH$_2$, —CH$_2$CH$_2$COOCH=CH$_2$, —CH$_2$CH$_2$COOC(CH$_3$)=CH$_2$, etc.

Examples of the compound of the formula (I) are triallyl isocyanurate, tris(2-hydroxyethyl)isocyanuric, acid ester, triacryloyl isocyanurate, trimethacryloyl isocyanurate, triallyloxycarbonyl isocyanurate, etc.

Examples of the compound of the formula (II) are triallyl cyanurate, triacryloyl cyanurate, trimethacryloyl cyanurate, triallyloxycarbonyl cyanurate, etc.

The prepolymer can be obtained by polymerization of the compound of the formula (I) or (II) by a conventional emulsion polymerization, solution polymerization with a chain transfer agent or ionic catalysts until the molecular weight becomes preferably about 5000 to 50000.

The prepolymer obtained by homopolymerization of the compound of the formula (I) or (II) is very fast in a cross-linking reaction and has a tendency to produce cracks on cured products during the cross-linking reaction. In such a case, it is preferable to use as the prepolymer a copolymer of at least one compound of the formula (I) or (II) and at least one compound of the formula:

wherein $R_4$ and $R_5$ are independently hydrogen or an organic group and at least one of $R_4$ and $R_5$ should be an organic group having at least one polymerizable unsaturated bond such as —CH=CH$_2$, —CH$_2$—CH=CH$_2$, —COCH=CH$_2$, —COC(CH$_3$)=CH$_2$, —COOCH=CH$_2$, —COOC(CH$_3$)=CH$_2$, —COOCH=CH$_2$, —COOCH$_2$—CH=CH$_2$, —COOC(CH$_3$)=CH$_2$, —CH$_2$CH$_2$COOCH=CH$_2$, or —CH$_2$CH$_2$COOC(CH$_3$)=CH$_2$.

Examples of the compound of the formula (III) are diallyl phthalate, divinylbenzene, diallylbenzene, diacryloylbenzene, dimethacryloylbenzene, styrene, hydroxystyrene, etc.

Copolymers of at least one compound of the formula (I) or (II) and at least one compound of the formula (III) having a molecular weight of preferably 5000 to 50000 can be produced by a conventional polymerization such as solution polymerization, emulsion polymerization or the like with a copolymerization ratio of 8:2 to 2:8.

The use of such a copolymer as the prepolymer is preferable from the viewpoint of moldability at the time of lamination or to improve flexibility of the laminate thus obtained.

As the cyclized polybutadiene, there can be use those obtained by cyclizing a polybutadiene, or those obtained by polymerizing butadiene monomer with cyclization. Preferable number average molecular weight ($\overline{M}n$) is 10,000 to 100,000.

The prepolymer and the cyclized polybutadine can be used in any proportions, but preferbly in the range of 3/7 to 7/3 by weight in terms of the ratio of prepolymer/cyclized polybutadiene.

The resin composition of this invention may contain one or more solvents, other polymerizable monomers such as monomers of the formula (I) or (II), conventional additives, etc.

By using the resin composition of this invention, a laminate can be produced as follows.

A varnish is prepared by dissolving a prepolymer, which is a homopolymer of a compound of the formula (I) or (II) or a copolymer of a compound of the formula (I) or (II) and a compound of the formula (III), and a cyclized polybutadiene in an organic solvent. In order to accelerate the dissolution, heating at a temperature of 80° C. or lower for about 30 minutes may be conducted.

Examples of the organic solvent are toluene, xylenes, 2-methoxy ethanol, N,N-dimethylformamide, N-methyl-2-pyrrolidone, etc. These solvents can be used alone or as a mixture thereof. Other solvents can also be used so long as these solvents can mix the prepolymer and the cyclized polybutadiene uniformly.

There is no particular limit to the mixing ratio of the prepolymer and the cyclized polybutadiene, but in order to exhibit properties of the two, it is preferable to mix the two in the range of 3:7 to 7:3.

To the thus prepared varnish, a radical polymarization initiator is added to give a varnish for impregnation.

Examples of the radical polymerization initiator are benzoyl peroxide, dicumyl peroxide, methyl ethyl ketone peroxide, t-butyl perbenzoate, t-butyl peroxylaurate, di-t-butyl peroxyphthalate, dibenzyl peroxide, etc. The radical polymerization initiator can be used in an amount of preferably 0.1 to 10 parts by weight per 100 parts by weight of the resin composition.

The varnish for impregnation is used for impregnating a sheet substrate, followed by drying at 80° to 130° C. to give a prepreg sheet. As the substrate, there can be used glass cloth, woven glass cloth, unwoven glass cloth, woven organic fiber cloth, unwoven organic fiber cloth, etc.

A laminate can be produced by piling a necessary number of prepreg sheets and conducting a curing reaction with heating at 100° to 200° C. under a pressure of 1 to 100 kgf/cm².

This invention is illustrated by way of the following Examples, in which all parts and percents are by weight unless otherwise specified.

EXAMPLE 1

To a xylene solution of cyclized polybutadiene (a 30% solution manufactured by Japan Synthetic Rubber Co., Ltd.), a prepolymer of triallyl isocyanurate homopolymer (manufactured by Nippon Kasei Chemical Co., Ltd.) was added and mixed uniformly, followed by addition of xylene to make the solid content 40%. The compounding ratio of the cyclized polybutadiene and the prepolymer is 5:5 (by weight). The mixture was dissolved with heating at 80° C. for 30 minutes. Then, 6 parts of dicumyl peroxide as a radical polymerization initiator per 100 parts of the resin to give a varnish. A glass cloth (WE-116E, a trade name, manufactured by Nitto Boseki Co., Ltd., 0.1 mm thick) was impregnated with the varnish and dried at 110° C. for 30 minutes in a constant temperature air bath to give a prepreg having a 60% resin content.

Ten piles of the prepreg sheets thus obtained were piled with copper foils of 0.07 mm thick having been subjected to chemical roughening treatment on the top and bottom sides, and pressed at a pressure of 30 kgf/cm² and a mold temperature of 130° C. for 30 minutes, and at the same pressure and a mold temperature of 170° C. for 1 hour, followed by post cure at 220° C. for 2 hours in a constant temperature air bath to give a laminate with a resin content of 50%.

EXAMPLE 2

To a xylene solution of cyclized polybutadiene (a 30% solution manufactured by Japan Synthetic Rubber Co., Ltd.), a copolymer of triallyl isocyanurate and diallyl phthalate (copolymerization ratio 3:7) as a prepolymer was added and mixed uniformly, followed by addition of xylene to make the solid content 40%. The compounding ratio of the cyclized polybutadiene and the copolymer prepolymer was 5:5 (by weight). The mixture was dissolved with heating at 80° C. for 30 minutes. Then, 6 parts of dicumyl peroxide as a radical polymerization initiator per 100 parts of the resin to give a varnish. A glass cloth (WE-116E) was impregnated with the varnish and dried at 120° C. for 20 minutes in a constant temperature air bath to give a prepreg having a 60–65% resin content.

Ten piles of the prepreg sheets thus obtained were piled with copper foils in the same manner as described in Example 1, and pressed at a pressure of 30 kgf/cm² and a mold temperature of 170° C. for 1 hour, followed by post cure at 220° C. for 2 hours to give a laminate with a resin content of 50–55%.

EXAMPLE 3

A laminate was obtained in the same manner as described in Example 2 except for changing the compounding ratio of the cyclized polybutadiene and the copolymer prepolymer to 3:7 (by weight) in the resin composition.

COMPARATIVE EXAMPLES 1 AND 2

Laminates were obtained in the same manner as described in Example 2 except for using as impregnating resin the cyclized polybutadiene alone (Comparative Example 1), and the copolymer of triallyl isocyanurate and diallyl phthalate (copolymerization ratio 3:7) alone (Comparative Example 2).

Properties of the laminates were tested and shown in Table 1 together with those of commercially available epoxy resin laminate and polyimide resin laminate widely used for printed circuit boards today.

TABLE 1

| Example No. | Example 1 | Example 2 | Example 3 | Comparative Example 1 | Comparative Example 2 | Epoxy resin laminate | Polyimide resin laminate |
|---|---|---|---|---|---|---|---|
| Dielectric constant (1 MHz) | 3.3 | 3.4 | 3.6 | 3.2 | 4.3 | 5.0 | 4.8 |
| Copper peeling strength (kg/cm) | 2.0 | 2.2 | 1.6 | 2.2 | 0.5 | 1.8 | 1.5 |
| Soldering heat resistance (300° C., 5 min) | o | o | o | o | x | x | o |
| Flexural strength (kg/mm²) | 40 | 40 | 45 | 27 | 55 | 55 | 55 |
| Pyrolysis beginning temp. of resin (°C.) | 350 | 330 | 320 | 260 | 330 | 280 | 330 |

Test conditions were as follows:

(1) Dielectric constant: JIS C-6481

(2) Copper peeling strength: JIS C-6481

(3) Soldering heat resistance: JIS C-6481. A laminate was dipped in a solder bath heated at 300° C. for 5 minutes and the surface state of the laminate was evaluated as follows: o no decomposition of resin and no blister was produced: x decomposition of resin and/or blisters were produced.

(4) Flexual strength: JIS C-6481

(5) Pyrolysis beginning temperature of resin: A temperature at which the weight decrease of the resin began was measured by raising the temperature at a rate of 5° C./min in an air atmosphere.

As is clear from Table 1, laminates having a dielectric constant of 4 or less, and being excellent in peeling strength for copper and mechanical strength can be produced by using the resin composition and the process according to this invention. As to the heat resistance, the property almost equal to that of polyimide now widely used can be obtained considering the pyrolysis beginning temperature.

EXAMPLE 4

A varnish for impregnating was prepared by dissolving 25 parts of an esterified product of tris(2-hydroxyethyl)isocyanuric acid and acrylic acid ($R_1$ through $R_3$ in the formula (I) being —$CH_2CH_2OOC$—$CH$=$CH_2$, FA-731A, a trade name manufactured by Hitachi Chemical Co., Ltd.), 50 parts of cyclized polybutadiene and 25 parts of tetrabromodiallyl isophthalate as fire retardant in xylene with heating at 60° C. for 30 minutes, cooling to room temperature and adding 5 parts of dicumyl peroxide per 100 parts of the weight of the resin. A glass cloth (WE-116E) was impregnated with the varnish, followed by drying at 120° C. for 20 minutes to give a prepreg having no sticking properties.

Ten piles of the prepreg sheets thus obtained were piled and pressed at a pressure of 20 kgf/cm² and a mold temperature of 130° C. for 30 minutes, followed by heating at 170° C. for 60 minutes under the same pressure to give a laminate.

The laminate had the following properties:

| | |
|---|---|
| Glass transition point (Tg) | 180° C. |
| Dielectric constant (1 MHz) | 3.6 |
| Flexural strength | 35 kgf/mm² |
| Pyrolysis temperature of resin | 320° C. |
| Copper peeling strength | 1.0 kgf/cm |

As explained above, laminates suitable as laminating materials for multi-layer printed circuit boards excellent in high-frequency electrical properties can be produced by using the relatively non-expensive resin composition of this invention and an apparatus for producing laminates widely used today for conventional epoxy and polyimide resins as it is. Further, the thus produced laminate has almost the same dielectric constant as the polybutadiene laminate now developed and can be improved remarkably in mechanical strength and heat resistance compared with the polybutadiene laminate.

Further according to this invention, since the prepregs can be obtained easily, multi-layer printed circuit boards can be produced by multi-layer adhesion under the same conditions as employed in conventional processes for producing laminates by using the laminates and prepregs obtained in this invention without losing various excellent properties.

What is claimed is:

1. A resin composition comprising
a prepolymer prepared by polymerizing at least one compound of the formula:

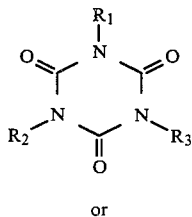

(I)

or

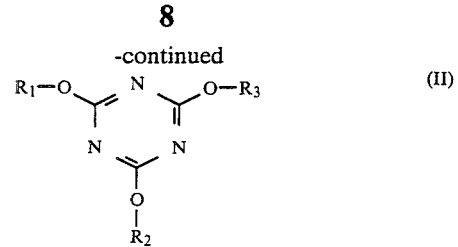

wherein
$R_1$ through $R_3$ are independently hydrogen or an organic group, at least two of $R_1$, $R_2$ and $R_3$ being organic groups having at least one polymerizable unsaturated bond, and
a cyclized polybutadiene.

2. A resin composition according to claim 1, wherein at least two of $R_1$, $R_2$ and $R_3$ in the formula (I) or (II) are groups represented by the formula: —CH=CH₂, —CH₂—CH=CH₂, —COCH=CH₂, —COC(CH₃)=CH₂, —COOCH=CH₂, —COOC(CH₃)=CH₂, —COOCH=CH₂, —COOC(CH₃)=CH₂, —CH₂CH₂COOCH=CH₂, —CH₂CH₂COOC(CH₃)=CH₂, or —COOCH₂—CH=CH₂.

3. A resin composition according to claim 1, wherein the compound of the formula (I) is triallyl isocyanurate.

4. A resin composition according to claim 1, wherein the prepolymer is a homopolymer of a compound of the formula (I) or (II).

5. A resin composition according to claim 1, wherein the prepolymer is a copolymer of at least on compound of the formula (I) or (II) and at least one compound of the formula:

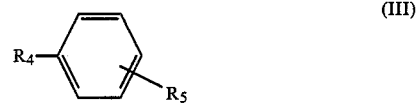

(III)

wherein $R_4$ and $R_5$ are independently hydrogen or an organic group, at least one of $R_4$ and $R_5$ being an organic group having at least one polymerizable unsaturated bond.

6. A resin composition according to claim 5, wherein at least one of $R_4$ and $R_5$ in the formula (III) is a group of the formula: —CH=CH₂, —CH₂—CH=CH₂, —COCH=CH₂, —COC(CH₃)=CH₂, —COOCH=CH₂, —COOC(CH₃)=CH₂, —COOCH=CH₂, —COOC(CH₃)=CH₂, —CH₂COOCH=CH₂, —CH₂CH₂COOC(CH₃)=CH₂, or —COOCH₂—CH=CH₂.

7. A resin composition according to claim 5, wherein the compound of the formula (III) is diallyl phthalate, divinylbenzene or diallylbenzene.

8. A prepreg obtained by impregnating a substrate with the resin composition of claim 1.

9. A laminate produced by laminating one or more prepregs obtained by impregnating a substrate with the resin composition of claim 1, followed by curing under pressure with heating.

10. A process for producing a laminate which comprises
adding a radical polymerization initiator to the resin composition of claim 1 to give a varnish,
impregnating a substrate with the varnish,
drying the resulting resin impregnated substrate to form a prepreg, piling two or more prepregs thus obtained, and molding under pressure with heating.

11. A prepreg obtained by impregnating a substrate with the resin composition of claim 4.

12. A prepreg obtained by impregnating a substrate with the resin composition of claim 5.

13. A laminate produced by laminating one or more prepregs of claim 11.

14. A laminate produced by laminating one or more prepregs of claim 12.

* * * * *